US007245885B2

(12) United States Patent
Kim

(10) Patent No.: US 7,245,885 B2
(45) Date of Patent: Jul. 17, 2007

(54) DEVICE FOR COMPENSATING FOR A MISMATCH OF A TRANSMITTER AND A METHOD OF COMPENSATING FOR THE MISMATCH

(75) Inventor: Young-Jin Kim, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 480 days.

(21) Appl. No.: 10/842,859

(22) Filed: May 11, 2004

(65) Prior Publication Data

US 2005/0014475 A1    Jan. 20, 2005

(30) Foreign Application Priority Data

Jul. 18, 2003    (KR) .................. 10-2003-0049030

(51) Int. Cl.
*H04B 1/04*    (2006.01)
(52) U.S. Cl. ................ 455/114.2; 455/115.1; 455/118
(58) Field of Classification Search ............ 455/114.2, 455/115.1, 118, 119, 129, 120
See application file for complete search history.

(56) References Cited

U.S. PATENT DOCUMENTS 6,330,290 B1 * 12/2001 Glas .................... 375/324
7,020,447 B2 * 3/2006 Nagatani et al. ......... 455/114.3
2002/0177425 A1 * 11/2002 Li ....................... 455/296
2003/0143966 A1 * 7/2003 Kim et al. ................ 455/209
2004/0038649 A1 * 2/2004 Lin et al. ................. 455/130
2004/0137869 A1 * 7/2004 Kim ....................... 455/324
2004/0142667 A1 * 7/2004 Lochhead et al. ....... 455/114.3
2005/0118963 A1 * 6/2005 Chiu ..................... 455/115.1

* cited by examiner

*Primary Examiner*—Edward F. Urban
*Assistant Examiner*—Christian A. Hannon
(74) *Attorney, Agent, or Firm*—F. Chau & Associates, LLC

(57) ABSTRACT

A device for compensating for a mismatch of a transmitter and a method of compensating for the mismatch is provided. The device for compensating for a mismatch of an up-converter in a direct conversion transmitter, comprises: a mismatch compensating unit for compensating for an input signal using a first mismatch compensation value to generate a mismatch compensation signal; a down-converter for down-converting a radio frequency (RF) signal to generate an intermediate frequency (IF) signal, the RF signal being generated by up-converting the mismatch compensation signal; a square unit for squaring the IF signal; and a controller for calibrating the first mismatch compensation value to determine a second mismatch compensation value such that a direct current (DC) component of the squared IF signal has a minimum value to compensate for the mismatch of the up-converter using the second mismatch compensation value.

18 Claims, 3 Drawing Sheets

DEVICE FOR COMPENSATING FOR A MISMATCH OF A TRANSMITTER AND A METHOD OF COMPENSATING FOR THE MISMATCH

CROSS-REFERENCE TO RELATED APPLICATION

This application claims priority to Korean Patent Application No. 2003-49030 filed on Jul. 18, 2003, the contents of which are incorporated herein by reference.

BACKGROUND OF THE INVENTION

1. Technical Field

The present invention relates to a device for compensating for a mismatch of a transmitter and a method of compensating for the mismatch, and more particularly, to a device and method for compensating for a mismatch of a transmitter that occurs when up-converting a direct conversion transmitter.

2. Discussion of the Related Art

In a communication device using heterodyne conversion, baseband signals are converted to radio frequency (RF) signals, and vice versa via a plurality of stages of intermediate frequency (IF) signals. The communication device using the heterodyne conversion utilizes a number of RF components such as a SAW (Surface Acoustic Wave) filter and an IF amplifier to reduce the cost and weight of the communication device.

In the communication device using direct conversion, baseband signals are converted to RF signals, and vice versa in a single step without an RF to IF conversion step. Thus, in such a communication device, for example, a mobile phone, the mobile phone's receiver or transmitter may be implemented using a small number of components or in a single chip. In addition, leaked local oscillation signals may be mixed between closely spaced circuit components, and high direct current (DC) offset levels may exist due to a mismatch of the transmitter or the receiver in such communication devices.

As a DC offset cancellation circuit for a direct conversion receiver has been disclosed in Korean Laid-Open Patent Publication No. 2003-0034472, there still exists a need for a DC offset cancellation circuit for use with a direct conversion transmitter.

SUMMARY OF THE INVENTION

According to one aspect of the present invention, a device for estimating a mismatch of a transmitter comprising an up-converter comprises: a mismatch compensating unit for receiving a first in-phase signal and a first quadrature-phase signal to generate a mismatch compensation signal using a mismatch compensation value; a down-converter for mixing a radio frequency (RF) signal with an oscillating signal to generate a second in-phase signal and a second quadrature-phase signal, wherein an up-converter generates the RF signal using the mismatch compensation signal; a first square unit for squaring the second in-phase signal; a second square unit for squaring the second quadrature-phase signal; a first adder for adding an output of the first square unit to an output of the second square unit; and a low pass filter for filtering an output of the first adder to generate an estimated mismatch value, wherein the mismatch compensation value is used to minimize the estimated mismatch value. The up-converter may be a direct up-converter.

The down-converter comprises a first local oscillator for generating a first oscillating signal; a first mixer for mixing the RF signal with the first oscillating signal to generate an intermediate frequency (IF) signal; a second low pass filter for filtering an output of the first mixer; a second local oscillator for generating a second oscillating signal; and a second mixer for mixing an output of the second low pass filter with the second oscillating signal to generate a second in-phase signal and a second quadrature-phase signal.

According to another aspect of the present invention, a method of compensating for a mismatch of a transmitter having a direct up-converter comprises: adjusting a phase and a gain of a first in-phase signal and a first quadrature-phase signal using a first mismatch compensation value to generate a mismatch compensation signal; up-converting the mismatch compensation signal to generate an RF signal; down-converting the RF signal to generate a second in-phase signal and a second quadrature-phase signal; squaring the second in-phase signal and the second quadrature-phase signal, to add the squared second in-phase signal to the squared second quadrature-phase signal, and to generate an estimated mismatch value; and generating a second mismatch compensation value that is determined such that the estimated mismatch value has a minimum value to compensate for the mismatch of the transmitter using the second mismatch compensation value.

According to yet another aspect of the present invention, a method of compensating for a mismatch of an up-converter comprises: compensating for an input signal using a first mismatch compensation value to generate a mismatch compensation signal; up-converting the mismatch compensation signal to generate an RF signal; down-converting the RF signal to generate an IF signal; squaring the IF signal; and repeating the above steps by changing the first mismatch compensation value to determine a second mismatch compensation value such that a direct current (DC) component of the squared IF signal has a minimum value, and to compensate for the mismatch of the up-converter using the second mismatch compensation value.

The first mismatch compensation value comprises a phase value or a gain value. The input signal comprises a first in-phase signal and a first quadrature-phase signal. Generating the mismatch compensation signal also comprises shifting a phase value of the first quadrature-phase signal based on a phase value of the first mismatch compensation value to generate a third quadrature-phase signal having a lead phase with respect to the first quadrature-phase signal; shifting the phase of the first quadrature-phase signal based on the phase value of the first mismatch compensation value to generate a fourth quadrature-phase signal having a delay phase with respect to the first quadrature-phase signal; adding the first in-phase signal to the third quadrature-phase signal to generate a first mismatch compensation signal; and obtaining a difference between the first in-phase signal and the fourth quadrature-phase signal to generate a second mismatch compensation signal. Generating the mismatch compensation signal further comprises amplifying the second mismatch compensation signal using the gain value of the first mismatch compensation value.

According to yet another aspect of the present invention, a device for compensating for a mismatch of an up-converter comprises: a mismatch compensating unit for compensating for an input signal using a first mismatch compensation value to generate a mismatch compensation signal; a down-converter for down-converting an RF signal to generate an IF signal, the RF signal being generated by up-converting the mismatch compensation signal; a square unit for squaring the IF signal; and a controller for calibrating the first mismatch compensation value to determine a second mismatch compensation value such that a DC component of the squared IF signal has a minimum value in order to compensate for the mismatch of the up-converter using the second mismatch compensation value.

The input signal comprises a first in-phase signal and a first quadrature-phase signal. The mismatch compensating unit further comprises: a first phase shifter for shifting a phase of the first quadrature-phase signal based on the phase value of the first mismatch compensation value to generate a third quadrature-phase signal having a lead phase with respect to the first quadrature-phase signal; a second phase shifter for shifting the phase of the first quadrature-phase signal based on the phase value of the first mismatch compensation value to generate a fourth quadrature-phase signal having a delay phase with respect to the first quadrature-phase signal; a first adder for adding the first in-phase signal to the third quadrature-phase signal to generate a first mismatch compensation signal; and a subtractor for obtaining a difference between the first in-phase signal and the fourth quadrature-phase signal to generate a second mismatch compensation signal.

The device further comprises an amplifier for amplifying the second mismatch compensation signal using the gain value of the first mismatch compensation value. The down-converter comprises: a first mixer for mixing mix the RF signal with a first oscillating signal to generate a first IF signal; a first low pass filter for filtering the first IF signal; and a second mixer for mixing an output of the second low pass filter with a second oscillating signal to generate a pair of second IF signals, the second IF signals being orthogonal each other. The square unit comprises: a first square unit for squaring one of the second IF signals; a second square unit for squaring one of the second IF signals; a second adder for adding an output of the first square unit to an output of the second square unit; and a second low pass filter for filtering an output of the first adder to extract a DC component from the output of the first adder.

BRIEF DESCRIPTION OF THE DRAWINGS

The features of the present invention will become more apparent by describing in detail exemplary embodiments thereof with reference to the accompanying drawings, in which.

DETAILED DESCRIPTION OF EXEMPLARY EMBODIMENTS

Figure 1:
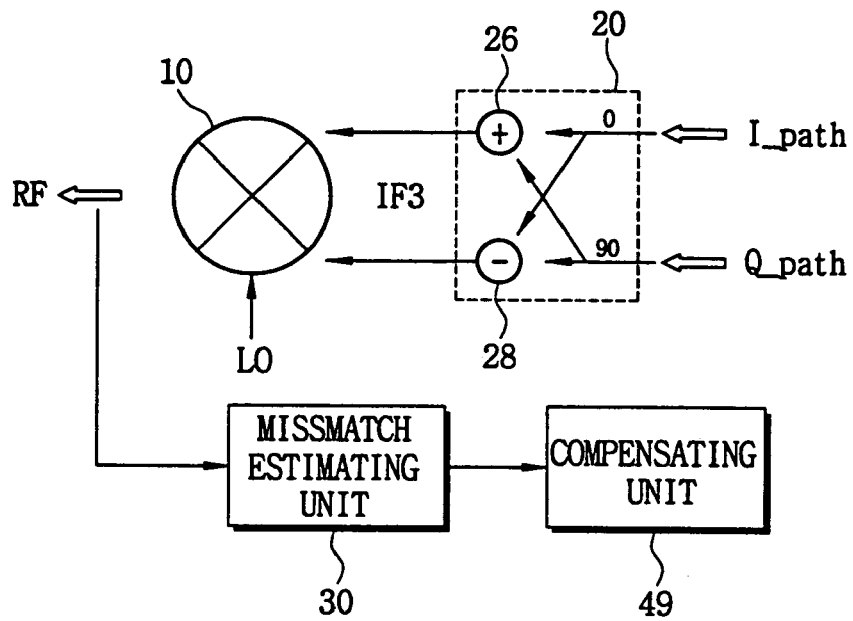
FIG. 1 illustrates an up-converter for estimating a mismatch of the up-converter according to an exemplary embodiment of the present invention.
Figure 2:
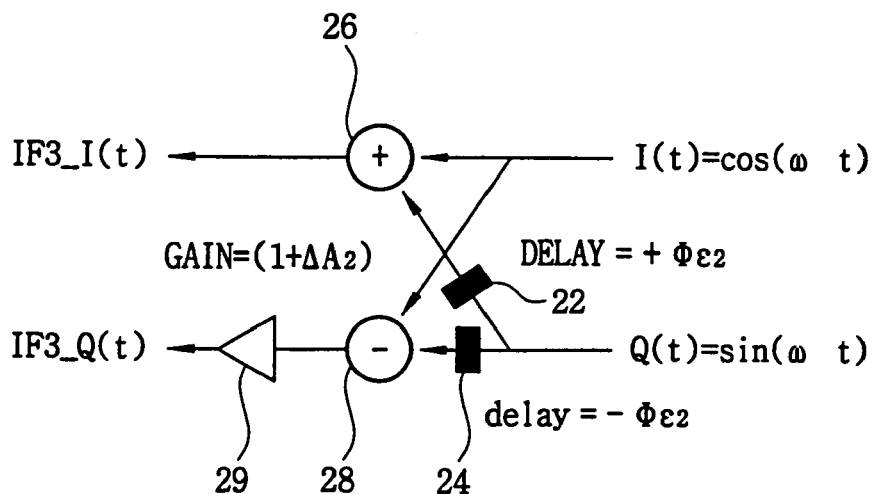
FIG. 2 illustrates a mismatch compensating unit according to another exemplary embodiment of the present invention.
Figure 3:
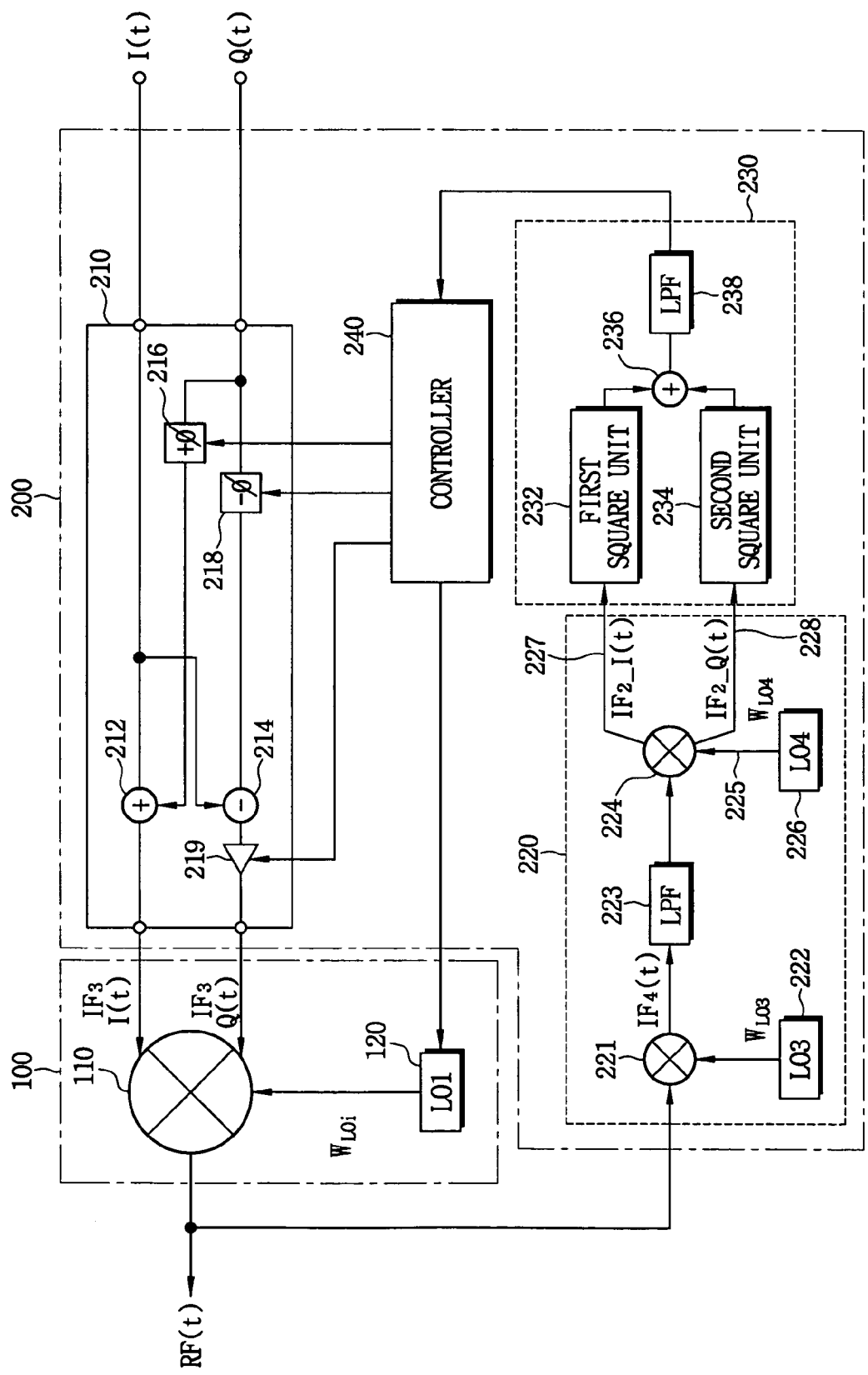
FIG. 3 is a block diagram showing a direct conversion transmitter having the mismatch compensating unit according to an exemplary embodiment of the present invention.

FIG. 1 illustrates an up-converter for estimating a mismatch of the up-converter according to an exemplary embodiment of the present invention, FIG. 2 illustrates a mismatch compensating unit according to another exemplary embodiment of the present invention, and FIG. 3 is a block diagram showing a direct conversion transmitter having the mismatch compensating unit according to an exemplary embodiment of the present invention.

Referring to FIG. 1, an up-converter 10 of a direct conversion transmitter includes a mismatch compensation value inserting unit 20, a mismatch estimating unit 30 and a compensating unit 49. The up-converter 10 mixes baseband signals such as an in-phase (I) signal and a quadrature-phase (Q) signal with a local oscillating signal LO, and up-converts the baseband signals to a radio frequency (RF) signal. A mismatch of the up-converter 10 is estimated and the mismatch of the up-converter 10 is compensated based on an estimated mismatch value in order to reduce signal distortion due to the mismatch of the up-converter 10.

A single tone baseband signal, into which a mismatch compensation value (or sweep variable) is inserted, is applied to the up-converter 10 via the mismatch compensation value inserting unit 20. The up-converter 10 mixes the local oscillating signal LO supplied from a local oscillator with mismatch compensation signals IF3_I(t) and IF3_Q(t) (shown in FIG. 2) using a mixer, and up-converts the mixed result to generate an RF signal RF(t) (shown in FIG. 3).

The mismatch estimating unit 30 down-converts the RF(t) signal, and estimates an estimated mismatch value such as a gain mismatch value and a phase mismatch value. The compensating unit 49 calibrates and compensates for the mismatch of the up-converter 10 based on the estimated mismatch value.

As shown in FIG. 2, when the up-converter 10 receives the baseband signals such as the in-phase (I) signal and the quadrature-phase (Q) signal, an adder 26 adds the in-phase (I) signal to a quadrature-phase (Q') signal to provide the added signal to the up-converter 10, and a subtractor 28 obtains a difference between the in-phase (I) signal and a quadrature-phase (Q") signal. An output of the subtractor 28 is amplified by an amplifier 29 (having a gain=1+$\Delta A2$) and is provided to the up-converter 10. In this case, the quadrature-phase (Q') signal has a lead phase with respect to the Q signal by $\phi_{e2}$, and the quadrature-phase (Q") signal has a delay phase with respect to the Q signal by $\phi_{e2}$. $\Delta A2$ is a gain mismatch compensation value, and $\phi_{e2}$ is a phase mismatch compensation value.

The up-converter 10 receives outputs from the adder 26 and the subtractor 28, and mixes the outputs of the adder 26 and the subtractor 28 with the local oscillating signal LO to generate the RF signal whose frequency corresponds to the sum of the output signal of the adder 26 (or the subtractor 28) and the local oscillating signal LO, or whose frequency corresponds to the frequency difference between the output signal of the adder 26 (or the subtractor 28) and the local oscillating signal LO. The RF signal output from the up-converter 10 is passed through a band pass filter and an amplifier (not shown) and is radiated from an antenna (not shown).

The RF signal output from the up-converter 10 is input to the mismatch estimating unit 30 to estimate the mismatch of the up-converter 10. The compensating unit 49 receives the estimated mismatch value and compensates the mismatch of the up-converter 10 using the estimated mismatch value.

Referring to FIG. 3, a direct conversion transmitter 100 is coupled to a mismatch estimating & compensating unit 200. The mismatch estimating & compensating unit 200 includes a mismatch compensating unit 210, a down-converter 220, a square unit 230 and a control unit 240.

The mismatch compensating unit 210 includes an adder 212, a subtractor 214, a first phase shifter 216, a second phase shifter 218 and an amplifier 219. The down-converter 220 includes first and second mixers 221 and 224, first and second local oscillators 222 and 226, and a low pass filter 223.

The controller 240 receives a direct current (DC) component from the square unit 230 and controls the first and second phase shifters 216 and 218, the amplifier 219, and the local oscillator LO1 120 of the direct conversion transmitter 100.

The first mixer 221 of the down-converter 220 mixes a local oscillating signal $\omega_{LO3}$ with the RF signal output from the transmitter 100 to generate an IF signal IF4(t). The low pass filter 223 removes unnecessary high frequency signals from the output signals of the first mixer 221. The second mixer 224 mixes a local oscillating signal $\omega_{LO4}$ with the low pass filtered signal output from the low pass filter 223 to generate IF signals IF2(t) such as an in-phase (I) signal IF2_I(t) 227 and an quadrature-phase (Q) signal IF2_Q(t) 228.

A first square unit 232 squares the in-phase (I) signal IF2_I(t) 227, and a second square unit 234 squares the quadrature-phase (Q) signal IF2_Q(t) 228. An adder 236 adds an output of the first square unit 232 to an output of the second square unit 234. A low pass filter 238 low pass filters an output of the adder 236 to extract a DC component from the output of the adder 236, and provides the extracted DC component to the controller 240.

The in-phase (I) signal and quadrature-phase (Q) signal input to the direct conversion transmitter 100 are defined as Equation 1.

$$I(t) = \cos(\omega_{IF3}t), \quad Q(t) = \sin(\omega_{IF3}t) \qquad \text{Equation 1}$$

When the in-phase (I) signal and quadrature-phase (Q) signal are treated with the gain mismatch compensation value $\Delta A_2$ and the phase mismatch compensation value $\phi_{\epsilon 2}$, the mismatch compensation signals IF3_I(t) and IF3_Q(t) are defined as Equation 2.

$$\text{IF3\_I}(t) = \frac{1}{2}[\cos(\omega_{IF3}t) + \sin(\omega_{IF3}t + \phi_{\epsilon 2})] \qquad \text{Equation 2}$$

$$\text{IF3\_Q}(t) = \frac{1}{2}[\sin(\omega_{IF3}t - \phi_{\epsilon 2}) - \cos(\omega_{IF3}t)](1 + \Delta A_2)$$

When $\omega_{SP} = \omega_{LO1} + \omega_{IF3}$ and $\omega_{data} = \omega_{LO1} - \omega_{IF3}$, the RF signal RF(t) is defined as Equation 3.

$$RF(t) = \frac{1}{4}(1 + \Delta A_1)[\cos(\omega_{SP}t) + \sin(\omega_{SP}t + \phi_{\epsilon 2})] + \qquad \text{Equation 3}$$

$$\frac{1}{4}(1 + \Delta A_2)[-\cos(\omega_{SP}t + \phi_{\epsilon 1} - \phi_{\epsilon 2}) - \sin(\omega_{SP}t + \phi_{\epsilon 2})] +$$

$$\frac{1}{4}(1 + \Delta A_1)[\cos(\omega_{data}t) - \sin(\omega_{data}t - \phi_{\epsilon 2})] +$$

$$\frac{1}{4}(1 + \Delta A_2)[\cos(\omega_{data}t + \phi_{\epsilon 1} - \phi_{\epsilon 2}) - \sin(\omega_{SP}t + \phi_{\epsilon 1})]$$

As shown in Equation 3, $\Delta A_1$ is a gain mismatching value of the transmitter 100, and $\phi_{\epsilon 1}$ is a phase mismatching value of the transmitter 100.

Because a mixer of the up-converter 110 outputs the sum frequency ($\omega_{LO1} + \omega_{IF3}$) signal and the difference frequency ($\omega_{LO1} - \omega_{IF3}$) signal, only the sum frequency ($\omega_{LO1} + \omega_{IF3}$) signal is selected by a band pass filter (not shown) and is provided to the down-converter 220 as the RF signal.

The IF4 (t) signal is defined as Equation 4 shown below. When the first mixer 221 uses the local oscillating signal ($\omega_{LO3}$), the mixer 221 outputs a sum frequency ($\omega_{LO3} + \omega_{SP}$) sp) signal and a difference frequency ($\omega_{LO3} - \omega_{SP}$) signal, and the low pass filter 223 selects the difference frequency ($\omega_{LO3} - \omega_{SP}$) signal.

$$IF4(t) = \frac{1}{8}(1 + \Delta A_1)[\cos(\omega_{IF4}t) + \sin(\omega_{IF4}t + \phi_{\epsilon 2})] + \qquad \text{Equation 4}$$

$$\frac{1}{8}(1 + \Delta A_2)[-\cos(\omega_{IF4}t + \phi_{\epsilon 1} - \phi_{\epsilon 2}) -$$

$$\sin(\omega_{IF4}t + \phi_{\epsilon 1})]$$

When the second mixer uses the local oscillating signal ($\omega_{LO4}$) and when $\omega_{IF4} - \omega_{LO4} = \omega_{IF2}$), the IF2_I(t) signal 227 and IF2_Q(t) signal 228 are defined as Equation 5.

$$\text{IF2\_I}(t) = \frac{1}{16}(1 + \Delta A_1)[\cos(\omega_{IF2}t) + \sin(\omega_{IF2}t + \phi_{\epsilon 2})] + \qquad \text{Equation 5}$$

$$\frac{1}{16}(1 + \Delta A_2)[-\cos(\omega_{IF2}t + \phi_{\epsilon 1} - \phi_{\epsilon 2}) -$$

$$\sin(\omega_{IF2}t + \phi_{\epsilon 1})]$$

$$\text{IF2\_Q}(t) = \frac{1}{16}(1 + \Delta A_1)[\sin(\omega_{IF2}t) + \cos(\omega_{IF2}t + \phi_{\epsilon 2})] +$$

$$\frac{1}{16}(1 + \Delta A_2)[-\sin(\omega_{IF2}t + \phi_{\epsilon 1} - \phi_{\epsilon 2}) -$$

$$\cos(\omega_{IF2}t + \phi_{\epsilon 1})]$$

The IF2_I(t) signal 227 and IF2_Q(t) signal 228 are squared by the square units 232 and 234, respectively, are added each other by the adder 236, is low pass filtered by the low pass filter 238, and the estimated mismatch value is defined as Equation 6.

$$\text{squaring}(IF2\_I^2 + IF2\_Q^2) = \qquad \text{Equation 6}$$

$$\frac{1}{16^2}\left\{\begin{array}{l}[(1 + \Delta A_1)\cos(\Delta\omega t) - (1 + \Delta A_2) \\ \cos(\Delta\omega t + \phi_{\epsilon 1} - \phi_{\epsilon 2})] + \\ [(1 + \Delta A_1)\sin(\Delta\omega t + \phi_{\epsilon 2}) - (1 + \Delta A_2)\sin(\Delta\omega t + \phi_{\epsilon 1})]\end{array}\right\}^2 +$$

$$\frac{1}{16^2}\left\{\begin{array}{l}[(1 + \Delta A_1)\sin(\Delta\omega t) - (1 + \Delta A_2) \\ \sin(\Delta\omega t + \phi_{\epsilon 1} - \phi_{\epsilon 2})] + \\ [(1 + \Delta A_1)\cos(\Delta\omega t + \phi_{\epsilon 2}) - (1 + \Delta A_2)\cos(\Delta\omega t + \phi_{\epsilon 1})]\end{array}\right\}^2 =$$

$$\frac{1}{16^2}[(\Delta A_1 - \Delta A_2)^2 + (\phi_{\epsilon 1} - \phi_{\epsilon 2})^2]$$

Equation 6 shows that the gain mismatching value ΔA1 of the transmitter 100 and the phase mismatching value $\phi_{\epsilon 1}$ of the transmitter 100 may be tracked using the mismatch compensation values such as the gain mismatch compensation value ΔA2 and the phase mismatch compensation value $\phi_{\epsilon 2}$.

When ΔA2 and $\phi_{\epsilon 2}$ are set to satisfy the condition in which ΔA1=ΔA2 and $\phi_{\epsilon 1}=\phi_{\epsilon 2}$ so that the DC component of Equation 6 is minimized, the mismatch of the transmitter 100 is compensated. Therefore, the controller 240 changes the mismatch compensation values ΔA2 and $\phi_{\epsilon 2}$ to determine the final mismatch compensation values ΔA2' and $\phi_{\epsilon 2}$' that minimize the mismatch of the transmitter 100. The controller 240 provides the final mismatch compensation values ΔA2' and $\phi_{\epsilon 2}$' to the local oscillator LO1 120, the phase shifters 216 and 218, and the amplifier 219.

Figure 4:
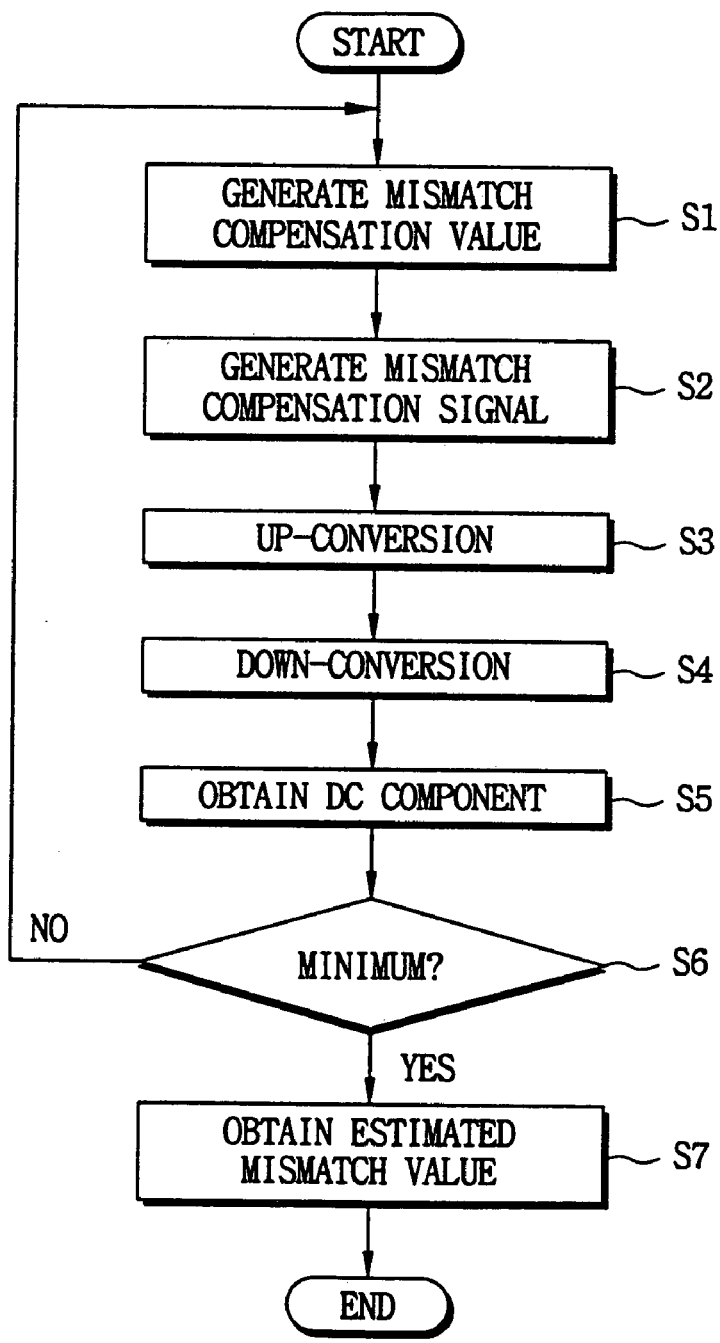
FIG. 4 is a flowchart showing a method of estimating the mismatch of the up-converter according to an exemplary embodiment of the present invention.

FIG. 4 is a flowchart showing a method of estimating the mismatch of the up-converter (e.g., 10 and 110 of FIGS. 1 and 3) according to an exemplary embodiment of the present invention. Referring to FIG. 4, mismatch compensation values ΔA2 and $\phi_{\epsilon 2}$ are generated (step S1), and the mismatch compensation values ΔA2 and $\phi_{\epsilon 2}$ are incorporated with a single tone input signals such an in-phase (I) signal and a quadrature-phase (Q) signal, and mismatch compensation signals IF3_I(t) and IF3_Q(t) are generated (step S2). The mismatch compensation signals IF3_I(t) and IF3_Q(t) are up-converted into an RF signal by the up-converter 110 of FIG. 3 (step S3).

The RF signal is down-converted by the down-converter 220 of FIG. 3, and the IF2_I(t) signal 227 and IF2_Q(t) signal 228 (both of FIG. 3) are generated (step S4). A DC component corresponding to the mismatch value of the transmitter 100 is obtained using the IF2_I(t) signal 227 and IF2_Q(t) signal 228 (step S5). The DC component may be changed depending upon the mismatch compensation values ΔA2 and $\phi_{\epsilon 2}$.

The estimated mismatch value is obtained when the mismatch compensation values ΔA2 and $\phi_{\epsilon 2}$ satisfy the condition in which the DC component has minimum value. It is determined if the mismatch compensation values ΔA2 and $\phi_{\epsilon 2}$ satisfy the condition in which the DC component has a minimum value (step S6). When the DC component does not have the minimum value, steps S1-S5 are repeated. When the DC component has the minimum value, the mismatch compensation values ΔA2 and $\phi_{\epsilon 2}$ are set as the estimated mismatch value (step S7). The estimated mismatch value may be stored, for example, in a storage medium such as an electronically erasable programmable read only memory (EEPROM), flash memory, register, etc.

It is to be understood that the mismatch estimating & compensating unit 200 may be implemented in the same chip as, for example, the up-converter 10 of FIG. 1. Alternately, the mismatch estimating & compensating unit 200 may be implemented in a separate chip as the up-converter 10.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

What is claimed is:

1. A device for estimating a mismatch of a transmitter comprising:
    a mismatch compensating unit configured to receive a first in-phase signal and a first quadrature-phase signal, configured to shift, based on a mismatch compensation value, a phase of the first in-phase signal in a first direction and a phase of the first quadrature-phase signal in a second direction, and configured to calculate a third in-phase signal by adding the first in-phase signal to the shifted first quadrature-phase signal in the first direction and a third quadrature-phase signal by amplifying, based on the mismatch compensation value, a value obtained by subtracting the first in-phase signal from the shifted first quadrature-phase signal in the second direction;
    an up-converter configured to up-convert baseband signals to a radio frequency (RF) signal based on the mismatch compensation value, the baseband signals is including the third in-phase signal and the third quadrature-phase signal;
    a down-converter configured to mix the RF signal with an oscillating signal to generate a second in-phase signal and a second quadrature-phase signal; and
    a square unit configured to square the second in-phase signal and the second quadrature-phase signal, configured to add the squared second in-phase signal to the squared second quadrature-phase signal and configured to filter the added value to generate an estimated mismatch value used for determining the mismatch compensation value.

2. The device of claim 1, wherein the mismatch compensation value is determined to minimize the estimated mismatch value.

3. The device of claim 1, wherein the up-converter is a direct up-converter.

4. The device of claim 1, wherein the mismatch compensating unit comprises:
    a phase shifting unit for shifting, based on the mismatch compensation value, the phase of the first quadrature-phase signal to generate a fourth quadrature-phase signal and a fifth quadrature-phase signal, the fourth quadrature-phase signal corresponding to a lead phase with respect to the first quadrature-phase signal and the fifth quadrature-phase signal corresponding to a delay phase with respect to the first quadrature-phase signal;
    an adder for adding the first in-phase signal to the fourth quadrature-phase signal to output the added value as the third in-phase signal;
    a subtractor for subtracting the first in-phase signal from the fifth quadrature-phase signal; and
    an amplifier for amplifying an output of the subtractor to output the amplified value as the third quadrature-phase signal, wherein a gain of the amplifier varies based on the mismatch compensation value.

5. The device of claim 1, wherein the down-converter comprises:
    a first local oscillator for generating a first oscillating signal
    a first mixer for mixing the RF signal with the first oscillating signal to generate an intermediate frequency (IF) signal;
    a first low pass filter for filtering an output of the first mixer;
    a second local oscillator for generating a second oscillating signal; and
    a second mixer for mixing an output of the first low pass filter with the second oscillating signal to generate a second in-phase signal and a second quadrature-phase signal.

6. A method of compensating for a mismatch of a transmitter comprising:
    shifting, based on a mismatch compensation value, a phase of a first in-phase signal in a first direction and a phase of a first quadrature-phase signal in second direction;

calculating a third in-phase signal by adding the first in-phase signal to the shifted first quadrature-phase signal in the first direction and a third quadrature-phase signal by amplifying, based on the mismatch compensation value, a value obtained by subtracting the first in-phase signal from the shifted first quadrature-phase signal in the second direction;

up-converting baseband signals to a radio frequency (RF) signal based on the mismatch compensation value, the baseband signals including the third in-phase signal and the third quadrature-phase signal;

mixing the RF signal with an oscillating signal to generate a second in-phase signal and a second quadrature-phase signal;

squaring the second in-phase signal and the second quadrature-phase signal;

adding the squared second in-phase signal to the squared second quadrature-phase signal;

filtering the added value to generate an estimated mismatch value; and generating the mismatch compensation value based on the estimated mismatch value so that the mismatch compensation value is used to compensate for the mismatch of the transmitter.

7. The method of claim 6, wherein the mismatch compensation value is determined to minimize the estimated mismatch value.

8. The method of claim 6, wherein the mismatch compensation value comprises a phase value or a gain value.

9. The method of claim 6, wherein shifting the phase of the first in-phase signal and the phase of the first quadrature-phase signal comprises:

shifting, based on the mismatch compensation value, the phase of the first quadrature-phase signal based on the phase value of the mismatch compensation value to generate a fourth quadrature-phase signal having a lead phase with respect to the first quadrature-phase signal; and shifting, based on the mismatch compensation value, the phase of the first quadrature-phase signal based on the phase value of the first mismatch compensation value to generate a fifth quadrature-phase signal having a delay phase with respect to the first quadrature-phase signal.

10. The method of claim 6, wherein filtering the added value to generate an estimated mismatch value comprises extracting a direct current (DC) component from the added value.

11. The method of claim 10, wherein the mismatch compensation value is generated such that the DC component is minimized.

12. A device for compensating for a mismatch of a transmitter comprising:

a mismatch compensating unit configured to receive a first in-phase signal and a first quadrature-phase signal, configured to shift, based on a mismatch compensation value, a phase of the first in-phase signal in a first direction and a phase of the first quadrature-phase signal in a second direction, and configured to calculate a third in-phase signal by adding the first in-phase signal to the shifted first quadrature-phase signal in the first direction and a third quadrature-phase signal by amplifying, based on the mismatch compensation value, a value obtained by subtracting the first in-phase signal from the shifted first quadrature-phase signal in the second direction;

an up-converter configured to up-convert baseband signals to a radio frequency (RF signal based on the mismatch compensation value, the baseband signals including the third in-phase signal and the third quadrature-phase signal;

a down-converter configured to mix the RF signal with a first oscillating signal to generate a second in-phase signal and a second quadrature-phase signal;

a square unit configured to square the second in-phase signal an the second quadrature-phase signal, configured to add the squared second in-phase signal to the squared second quadrature-phase signal and configured to filter the added value to generate an estimated mismatch value; and a controller configured to generate the mismatch compensation value based on the estimated mismatch value so that the mismatch compensation value is used to compensate for the mismatch of the transmitter.

13. The device of claim 12, wherein the first mismatch compensation value comprises a phase value or a gain value.

14. The device of claim 13, wherein the mismatch compensating unit comprises:

a first phase shifter for shifting, based on the mismatch compensation value, the phase of the first quadrature-phase signal based on the phase value of the mismatch compensation value to generate a fourth quadrature-phase signal having a lead phase with respect to the first quadrature-phase signal;

a second phase shifter for shifting, based on the mismatch compensation value, the phase of the first quadrature-phase signal based on the phase value of the first mismatch compensation value to generate a fifth quadrature-phase signal having a delay phase with respect to the first quadrature-phase signal;

a first adder for adding the first in-phase signal to the fourth quadrature-phase signal;

a subtractor for obtaining a difference between the first in-phase signal and the fifth quadrature-phase signal; and an amplifier for amplifying the difference based on the mismatch compensation value.

15. The device of claim 12, wherein the down-converter comprises:

a first mixer for mixing the RF signal with the first oscillating signal to generate a first IF signal;

a first low pass filter for filtering the first IF signal; and a second mixer for mixing the filtered IF signal with a second oscillating signal to generate the second in-phase signal and the second quadrature-phase signal.

16. The device of claim 15, wherein the square unit comprises:

a first square unit for squaring the second in-phase signal;

a second square unit for squaring the second quadrature-phase signal;

a second adder for adding the squared second in-phase signal to the squared second quadrature-phase signal; and a second low pass filter for filtering the added value to generate an estimated mismatch value.

17. The device of claim 12, wherein the square unit extracts a direct current (DC) component from the added value.

18. The device of claim 17, wherein the controller generates the mismatch compensation value such that the DC component is minimized.

* * * * *